United States Patent
Bhatia et al.

(10) Patent No.: US 10,033,407 B2
(45) Date of Patent: Jul. 24, 2018

(54) OPTIMIZATION OF LOW DENSITY PARITY-CHECK CODE ENCODER BASED ON A SEARCH FOR AN INDEPENDENT SET OF NODES

(71) Applicant: SK Hynix Inc., Gyeonggi-do (KR)

(72) Inventors: Aman Bhatia, San Jose, CA (US); Wei-Hao Yuan, San Jose, CA (US); Yi-Min Lin, San Jose, CA (US); Naveen Kumar, San Jose, CA (US); Fan Zhang, San Jose, CA (US); Johnson Yen, Fremont, CA (US)

(73) Assignee: SK Hynix Inc., Gyeongi-do (KR)

( * ) Notice: Subject to any disclaimer, the term of this patent is extended or adjusted under 35 U.S.C. 154(b) by 0 days.

(21) Appl. No.: 15/431,559

(22) Filed: Feb. 13, 2017

(65) Prior Publication Data

US 2017/0294923 A1  Oct. 12, 2017

Related U.S. Application Data

(60) Provisional application No. 62/319,975, filed on Apr. 8, 2016.

(51) Int. Cl.
*H03M 13/00* (2006.01)
*H03M 13/11* (2006.01)
*G06F 11/10* (2006.01)

(52) U.S. Cl.
CPC ..... *H03M 13/1108* (2013.01); *G06F 11/1076* (2013.01); *H03M 13/116* (2013.01);
(Continued)

(58) Field of Classification Search
CPC ........... H03M 13/1108; H03M 13/116; H03M 13/611; H03M 13/616; H03M 13/118; G06F 11/1076
See application file for complete search history.

(56) References Cited

U.S. PATENT DOCUMENTS 7,072,417 B1 *  7/2006  Burd ............... H03M 13/118
                                                    375/295
7,162,684 B2 *  1/2007  Hocevar .......... H03M 13/116
                                                    714/800
(Continued)

OTHER PUBLICATIONS

Marco Baldi et al, "Optimization of the parity-check matrix density in QC-LDPC code-based McEliece cryptosystems," Mar. 11, 2013, IEEE ICC 2013—Workshop on Information Security over Noisy and Lossy Communication Systems Copyright transferred to IEEE, 10 pages.

(Continued)

*Primary Examiner* — Christine Tu
(74) *Attorney, Agent, or Firm* — Kilpatrick Townsend & Stockton LLP

(57) ABSTRACT

Techniques are described for optimizing a parity-check matrix for a low density parity check (LDPC) encoder. In an example, a first parity-check matrix is accessed. Based on a set of rules, an independent set of check nodes and variable nodes is determined. The set of rules specifies that a check node associated with the first parity-check matrix belongs to the independent set when the check node is connected to only one variable node from the independent set. The set of rules further specifies that a variable node associated with the first parity-check matrix belongs to the independent set when the variable node is connected to only one check node from the independent set. A size of the independent set is based on the set of rules. A second parity-check matrix is generated by at least applying a permutation to the first parity-check matrix based on the independent set.

20 Claims, 10 Drawing Sheets

(52) U.S. Cl.
CPC ........ *H03M 13/118* (2013.01); *H03M 13/611* (2013.01); *H03M 13/616* (2013.01)

(56) References Cited

U.S. PATENT DOCUMENTS

| | | | |
|---|---|---|---|
| 7,243,286 B2 * | 7/2007 | Kim | H03M 13/1182 |
| | | | 714/752 |
| 7,260,763 B2 * | 8/2007 | Sukhobok | H03M 13/118 |
| | | | 714/758 |
| 8,473,824 B1 * | 6/2013 | Chaichanavong | H03M 13/033 |
| | | | 714/758 |
| 2007/0162821 A1 | 7/2007 | Hwang | |
| 2010/0169737 A1 | 7/2010 | Litsyn | |
| 2015/0095747 A1 | 4/2015 | Tamo | |

\* cited by examiner

OPTIMIZATION OF LOW DENSITY PARITY-CHECK CODE ENCODER BASED ON A SEARCH FOR AN INDEPENDENT SET OF NODES

CROSS-REFERENCES TO RELATED APPLICATIONS

The present application claims priority to Provisional Application No. 62/319,975 entitled "OPTIMIZATION OF QC-LDPC CODE ENCODER FOR LOWER HARDWARE COST AND COMPLEXITY," filed Apr. 8, 2016, which is assigned to the assignee hereof and expressly incorporated by reference herein in its entirety.

BACKGROUND

Data integrity is an essential feature for any data storage device. Use of strong error-correction codes (ECCs) is recommended for NAND flash memory devices as the storage density increases with the use of multi-level cell/triple level cell (MLC/TLC) NAND flash. Low-Density Parity-Check (LDPC) codes are often used as the ECC scheme in storage devices. Moreover, Quasi-Cyclic LDPC (QC-LDPC) codes that have circulant permutation matrices as sub-matrices in their parity-check matrix are often preferred because they allow simple implementations of the encoding and decoding algorithms.

During code design, the parity-check matrix for a LDPC code is typically constructed with random computer search or algebraic constructions to give best decoding performance. These construction methods may not lead to a parity-check matrix which has the structure preferred for an efficient encoder. Constraining the parity-check matrix to have a preferred structure during code construction may limit the decoding performance. Accordingly, existing systems may use a parity-check matrix optimized for an LDPC decoder, but not for an LDPC encoder. Although properly encoding bits, the sub-optimal use of the LDPC encoder may result in relatively larger memory usage and power consumption.

BRIEF SUMMARY

Techniques for optimizing a parity-check matrix for an LDPC encoder are described. In an example, the parity-check matrix is designed for an LDPC decoder. The optimization may include re-arranging columns and rows of the parity-check matrix to generate an encoder-optimized parity-check matrix. The LDPC encoder encodes information bits based on the encoder-optimized parity-check matrix.

The optimization involves applying a permutation to the original parity-check matrix such that the encoder-optimized parity-check matrix includes a large (relatively to a size threshold) or the largest possible identity sub-matrix. The use of such an identity sub-matrix reduces the memory usage and the power consumption on the encoding side by significant amounts (e.g., up to thirty percent and forty percent savings, respectively).

To find the optimal permutation, the optimization problem can be formulated as a search for independent check nodes and variable nodes from a bipartite graph (e.g., a Tanner graph) corresponding to the original parity-check matrix. Multiple solution approaches are possible. In one example solution, an undirected search graph is generated from the bipartite graph based on a set of rules. A greedy algorithm is then applied to derive the maximum independent set from the search graph. In another example, a find-matching algorithm is applied to the bipartite graph based on a set of rules to find the independent set. The permutation is then derived from the independent set such that the rows and columns of the original parity-check matrix are permuted based on the check nodes and variable nodes associated with the independent set to create the identity sub-matrix.

In an example, the original parity-check matrix is a QC-LDPC parity-check matrix. In this example, a protograph matrix is derived from the original parity-check matrix, where circulant submatrices are replaced with "0" or "1" representations based on a set of rules. The optimal permutation is then determined by applying any or a combination of the above solution approaches to the protograph matrix, resulting in an intermediary matrix. This intermediary matrix is expanded by re-inserting the circulant submatrices to create an encoder-optimized QC-LDPC parity-check matrix.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
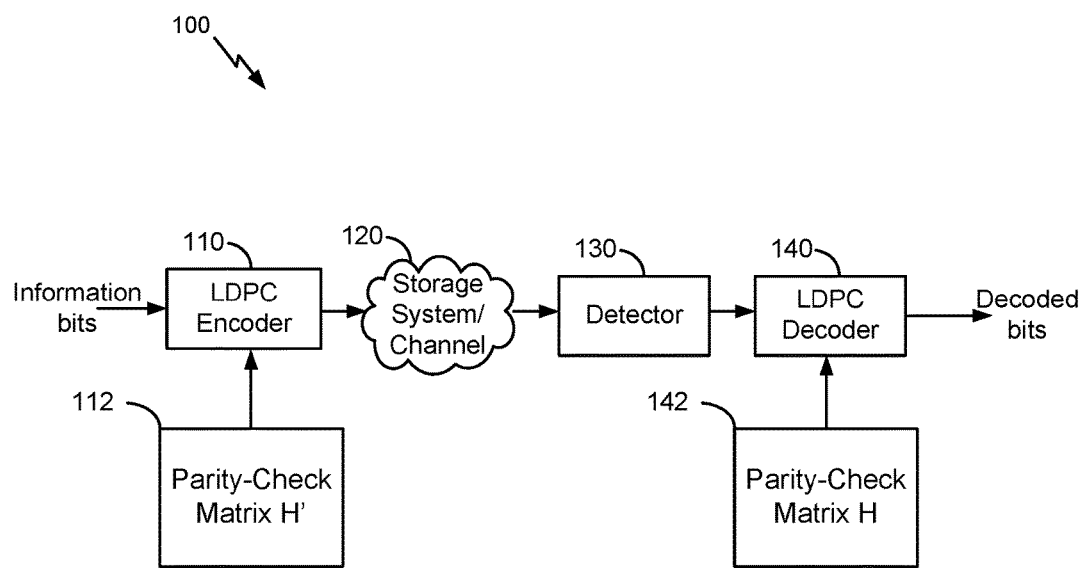
FIG. 1 illustrates an example high level block diagram of an error correcting system, in accordance with certain embodiments of the present disclosure.

Low density parity-check (LDPC) codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer search or algebraic constructions are possible. The random computer search construction describes an LDPC code having a parity-check matrix designed by a random computer-based procedure. Algebraic construction implies that the parity-check matrix has been constructed based on combinatorial methods. QC-LDPC codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

Embodiments of the present disclosure involve an optimization of a parity-check matrix H for use by an LDPC encoder. Whereas existing systems optimize the parity-check matrix H for the decoder, the embodiments herein further describe a permutation-based refinement to the parity-check matrix H, thereby resulting in an optimized parity-check matrix H' for the LDPC encoder. The LDPC encoder encodes bits based on the encoder-optimized parity-check matrix H' rather than the original parity-check matrix H. The LDPC decoder may decode the LDPC encoded data based on either parity-check matrices H or H'. Generally, usage of the encoder-optimized parity-check matrix H' results in up to thirty percent memory usage savings and up to forty percent power consumption savings on the encoding side relative to the alternate usage of the parity-check matrix H, without degradation to the encoding or decoding of bits.

In an example, the optimization involves re-arranging the parity-check matrix H to include the largest possible identity sub-matrix I. An identity sub-matrix I is a matrix in which all the elements of the principle diagonal are ones and all other elements are zeros. To do so, a search for an independent set of check nodes is performed based on a set of rules. Generally, the set of rules ensures that only proper check nodes and variable nodes are identified to create the independent set such that the independent set can be used to permute rows and columns of the parity-check matrix to create the identity sub-matrix I. The set of rules also ensures that the independent set has the largest possible size (or, some other size greater than a predefined size threshold) to ensure that the largest possible identity sub-matrix I is realized. The independent set is then used to apply a permutation to the parity-check matrix H. The permutation re-arranges the parity-check matrix H, such that the resulting parity-check matrix H' includes the identity sub-matrix I.

For instance, if the independent set includes a variable node represented in the first column of the parity-check matrix H, the permutation re-arranges the first column to the last column. Similarly, if the independent set includes a check node represented in the second row of the parity-check matrix H, the permutation re-arranges the second row to the first row. In this case, the permutation of the first column and second row creates the identity sub-matrix I (or a portion thereof) in the top right corner of the parity-check matrix H. Once the parity-check matrix H is re-arranged to include the identity sub-matrix I (e.g., in the top right corner) based on the independent set, the re-arranged parity-check matrix is set as the encoder-optimized parity-check matrix H'.

Because the encoder-optimized parity-check matrix H' includes an identity sub-matrix I of a known structure (e.g., ones for the diagonal elements, zeros otherwise), that portion of the parity-check matrix H' need not be stored for the LDPC encoder. Instead, it may be sufficient to store its dimension (e.g., the length of the diagonal in terms of the number of elements). In use, the identity sub-matrix I need not be accessed and loaded from a storage location, thereby saving on memory usage and power consumption. The larger the identity sub-matrix I, the larger the savings are. In an example, if the search returns the largest independent set, the permutation results in the largest identity sub-matrix I and, thus, the largest savings.

FIG. 1 illustrates an example high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of tLDPC codes including, for example, data transmission.

As illustrated, an LDPC encoder 110 receives information bits that include data which is desired to be stored in a storage system 120. LDPC encoded data is output by the LDPC encoder 110 and is written to the storage 120. The encoding relies on an encoder-optimized parity-check matrix H' 112. Techniques for generating and utilizing this parity-check matrix H' 112 are further described herein below.

In various embodiments, the storage 120 may include a variety of storage types or media such as (e.g., magnetic) disk drive storage, Flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by LDPC decoder are passed to the appropriate entity (e.g., the user or application which requested it). Generally, the decoding relies in a parity-check matrix 142, which is optimized for the LDPC decoder 140 by design. With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the code word and the other set of nodes, e.g., check nodes, correspond to the set of parity-check constraints satisfied by the code words. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a code word by p results in another code word. Here p is the size of square matrix which is either a zero matrix or a circulant matrix. This is a generalization of a cyclic code in which a cyclic shift of a code word by 1 results in another code word. The block of p×p matrix can be a zero matrix or cyclically shifted identity matrix of size p×p.

For the LDPC encoder 110, it is preferred that the parity-check matrix H 142 be partitioned to have a large identity sub-matrix I. The hardware cost of the LDPC encoder 110 and the computations needed for each encoding decrease when the size of the identity sub-matrix I increases, making a matrix with a larger identity sub-matrix more suitable for the encoder implementation. However, the primary aim during code design is decoding performance and encoder size is secondary. Restricting the parity-check matrix H 142 to have this structure during code design can limit the decoding performance of the LDPC code. Therefore a methodology is needed that can modify the parity-check matrix H 142 using row/column permutations into the structure preferred by the efficient encoder. While the parity-check matrix H 142 is set during the design of the LDPC code for efficient decoding, the permutations result in the encoder-optimized parity-check matrix H' 112. This parity-check matrix H' 112 is used for the encoding.

Embodiments of the present disclosure describe techniques for modifying the existing parity-check matrix 142 into the encoder-optimized parity-check matrix H' 112 by searching for the largest independent set of check nodes and variable nodes and permuting the parity-check matrix 142 to have the largest possible identity sub-matrix I. The larger the size of the identity sub-matrix I, the more gain is obtained in the encoder 110.

The search for the optimal modification can be formulated as a graph-theoretic optimization problem. In one embodiment, the techniques can provably guarantee to generate the most optimal modification, regardless of whether the column weight of the parity-check matrix H 142 is regular or irregular. Moreover, the technique also preserves the quasi-cyclic property of the parity-check matrix H 142 matrix when used for QC-LDPC codes with circulant permutation matrices. In one embodiment, the proposed technique uses very little computation for a large parity-check matrix H 142 when the optimality guarantees are not needed, or when the LDPC code is quasi-cyclic.

Generally, the existing parity-check matrix H 142 is permuted such that the encoder-optimized parity-check matrix H' 112 is expressed as:

$$H' = \begin{bmatrix} A & B & I \\ C & D & E \end{bmatrix},$$  Equation 1 where I is an $k_1 \times k_1$ identity matrix (or sub-matrix relative to H'), A is $k_1 \times k$ sparse matrix (or sub-matrix relative to H'), B is $k_1 \times (n-k-k_1)$ sparse matrix (or sub-matrix relative to H'), C is a $(n-k-k_1) \times k$ sparse matrix (or sub-matrix relative to H'), D is a $(n-k-k_1) \times (n-k-k_1)$ sparse matrix (or sub-matrix relative to H'), and E is a $(n-k-k_1) \times k_1$ sparse matrix (or sub-matrix relative to H'). Then the encoder 110 stores A, B, C, E as well as a dense matrix F that is given by $F=(E*B+D)^{-1}$.

The parity bits for the given information bits u are then computed in two steps:

$$p_1^T = F^*(E^*A+C)^*u^T$$  Equation 2, $$p_2^T = A^*u^T + B^*p_1^T$$  Equation 3.

The gains of using the encoder 110 may depend on the size of the identity sub-matrix I, $k_1$. The memory requirements as well as amount of computations for encoding decrease with an increase in the size $k_1$. Thus, the goal of the optimization is to find, for any given parity-check matrix H 142, the encoder-optimized parity-check matrix H' 112 by using only row/column permutations such that $k_1$ is as large as possible.

Various solutions exist for this optimization problem. In one example solution, an exhaustive search may be implemented to search for the largest possible identity sub-matrix I from all possible permutations of the parity-check matrix H 142. While this solution may result in the most optimal parity-check matrix H' 112, it also may involve a large amount of computation and computational cycles. Other less computationally complex solutions may instead be implemented and can result in the same or a similar optimal parity-check matrix H' 112. Examples of such less computationally complex solutions are further described in the next figures. Generally, these solutions rely on a set of rules that specifies a size of the independent set to be found and conditions to add pairs of check node and variable node to the independent set. The rules may also define how a permutation should be applied given the independent set, such as the order of the permutation.

In one example of such less computationally complex solutions, a search graph along a greedy algorithm can be implemented. While the parity-check matrix H 112 may be represented with a bipartite graph, such as a Tanner graph, the search graph can be generated from the bipartite graph according to the set of rules to capture information about connections between check nodes and variable nodes associated with the parity-check matrix 112 and represented in the bipartite graph. The greedy algorithm may be applied to the search graph to find a large independent set of check nodes and variable nodes.

In another example of the less computationally complex solutions, a find-match algorithm can be implemented. More specifically, the find-match algorithm is applied according to the set of rules to iteratively search for the acceptable pairs of check node and variable node for addition to the independent set until a desired size (e.g., the largest size) for the independent set is achieved.

In yet another example of the less computationally complex solutions, a hybrid between the search graph/greedy algorithm and the find-match algorithm is used. More specifically, the former technique may be applied first. The size of the outputted independent set may be compared to a size threshold. If unacceptable (e.g., below the size threshold), the find-match algorithm may be applied to find a larger sized independent set.

Figures 2A, 2B:
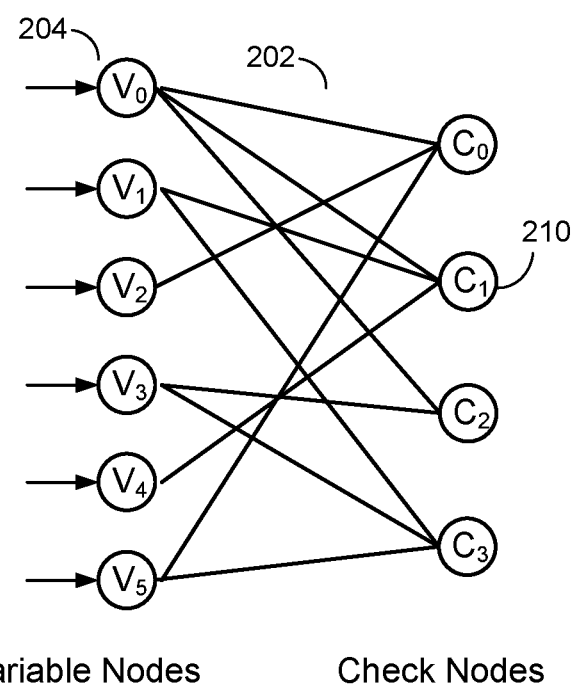
FIG. 2A-2B illustrate an example parity-check matrix and an example graph representing the parity-check matrix, in accordance with certain embodiments of the present disclosure.

FIG. 2A illustrates an example parity-check matrix H 200 and FIG. 2B illustrates an example bipartite graph corresponding to the parity-check matrix 200. In this example, the parity-check matrix 200 has six column vectors and four row vectors. Network 202 shows the network corresponding to the parity-check matrix 200 and represent a bipartite graph. Various type of bipartite graphs are possible including, for example, a Tanner graph.

Generally, the variable nodes in the network 202 correspond to the column vectors in the parity-check matrix 200. The check nodes in the network 202 correspond to the row vectors of the parity-check matrix 200. The interconnections between the nodes are determined by the values of the parity-check matrix 200. Specifically, a "1" indicates the corresponding check node and variable nodes have a connection. A "0" indicates there is no connection. For example, the "1" in the leftmost column vector and the second row vector from the top in the parity-check matrix 200 corresponds to the connection between the variable node 204 and the check node 210.

A message passing algorithm is generally used to decode LDPC codes. Several variations of the message passing algorithm exist in the art, such as min-sum algorithm, scaled min-sum algorithm or the like. In general, any of the variations of the message passing algorithm may be used in an LDPC decoder without departing from the teachings of the present disclosure. Message passing uses a network of variable nodes and check nodes, as shown in FIG. 2B. The connections between variable nodes and check nodes are described by and correspond to the values of the parity-check matrix 200, as shown in FIG. 2A.

A hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found or a maximum number of iterations are performed without finding a correct codeword. It should be noted that a soft-decision decoder works similarly, however, each of the messages that are passed among check nodes and variable nodes, also include reliability of each bit.

An example message passing algorithm may be performed. In this example, L(qij) represents a message that is sent by variable node $v_i$ to check node $c_j$; L($r_{ji}$) represents the message sent by check node $c_j$ to variable node $v_i$; and (L($c_i$) represents initial LLR value for each variable node $v_i$. Variable node processing for each L(qij) can be done through the following steps:
(1) Read L($c_i$) and L($r_{ji}$) from memory.
(2) Calculate L(Qi-sum)=L($c_i$)+Scaling Factor*$\Sigma_{j \in c_i}$L($r_{ij}$).
(3) Calculate each L(Qi-sum)−L($r_{ij}$).
(4) Output L(Qi-sum) and write back to memory.
(5) If this is not the last column of the memory, go to Step 1 and increment i by one.
(6) Compute parity-check-sums, if they are all equal to zero or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj\text{-sum}) = \left(\Pi_{i' \in R_j} \alpha_{i'j}\right) \phi\left(\Sigma_{i' \in R_j} \phi(\beta_{i'j})\right)$$

$$\alpha_{ij} = \text{sign}(L(q_{ij})), \beta_{ij} = |L(q_{ij})|,$$

$$\phi(x) = -\log\left(\tanh\left(\frac{x}{2}\right)\right) = \log\left(\frac{e^x + 1}{e^x - 1}\right)$$

(3) Calculate the individual L($r_{ji}$)=($\Pi_{i' \in Rj \setminus i} \alpha_{i'j}$)ø($\Sigma_{i' \in Rj \setminus i}$ø($\beta_{i'j}$)) for check nodes.
(4) Write back L($r_{ji}$) to memory.
(5) If this is not the last row of memory, then go to the first step and increment j by one.

Figure 3:
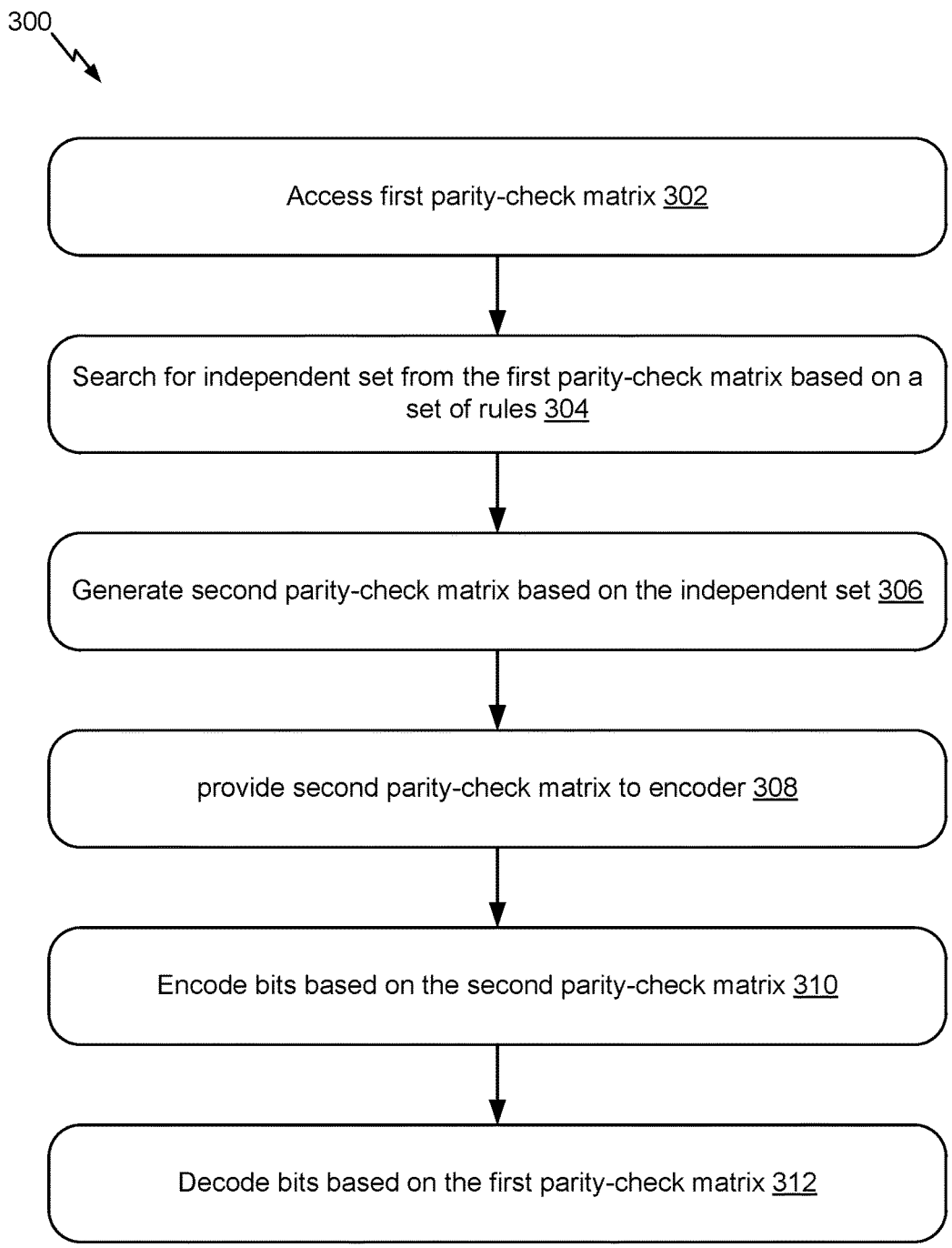
FIG. 3 illustrates an example flow for modifying a parity-check matrix designed for an LDPC decoder into a parity-check matrix optimized for an LDPC encoder, in accordance with certain embodiments of the present disclosure.

FIG. 3 illustrates an example flow 300 for modifying a parity-check matrix designed for an LDPC decoder into a parity-check matrix optimized for an LDPC encoder. In the interest of clarity of explanation, the former parity-check matrix is referred to herein as the original parity-check matrix or a first parity check matrix. The latter parity-check matrix is referred to herein as the encoder-optimized parity-check matrix or a second parity check matrix. The example flow 300 also facilitates using the two parity-check matrices to encode and decode bits.

A system is described as performing particular operations of the example flow 300. In particular, the system includes an offline system and an error correcting system. One of or both systems may have a specific hardware configuration to perform the operations. Alternatively, one of or both systems may include generic hardware configured with specific instructions. For instance, each of the systems includes one or more processors and one or more memories. The memory(ies) of a system stores computer-readable instructions to embody functionalities specific to that system. The instructions when executed by the processor(s) of the system result in performance of the functionalities by the system.

Generally, the offline system is configured to generate the encoder-optimized parity-check matrix. In comparison, the error correcting system is configured to encode and decode bits. For instance, the error correction system includes an LDPC encoder and an LDPC decoder among other components, as described in connection with FIG. 1. The LDPC encoder relies on the optimized parity-check matrix to encode information bits. The LDPC decoder relies on the original parity-check matrix or the optimized parity-check matrix to decode the encoded bits.

As illustrated, the example flow 300 starts at operation 302, where the offline system accesses the first parity-check matrix. In an example, the first parity-check matrix is the original parity check-matrix designed for the LDPC decoder, such as the parity check-matrix 142 of FIG. 1. The first parity-check matrix can be accessed from local storage of the offline system or from remote storage (e.g., from the storage local to the error correcting system).

At operation 304, the offline system searches for an independent set from the first parity-check matrix based on a set of rules. The set of rules can be accessed from the local storage and can define conditions to create the independent set. In an example, the offline system applies the set of rules to a bipartite graph of the first parity-check matrix. Examples of how the rules are applied are further described in the next figures. Once applied, an output is an independent set of check nodes and variable nodes, where these check nodes and variable nodes are associated with the first parity-check matrix (e.g., represented in the bipartite graph) and are added to the independent set based on the set the of rules.

In an example, the set of rules defines a desired size of the independent set, such as a predefined size threshold or a maximum size (e.g., to search for a maximum independent set). The predefined size threshold may correspond to a dimension of an identity sub-matrix I or to a fraction of the number of rows or the number of columns of the first parity-check matrix.

The set of rules also defines conditions for the adding a pair of check node and variable node associated with the first parity-check matrix (e.g., from a bipartite graph thereof) to the independent set. For example, the set of rules specifies that a check node associated with the first parity-check matrix (e.g., from the bipartite graph) belongs to the independent set when the check node is connected to only one variable node from the independent set. Likewise, the set of rules specifies that a variable node associated with the first parity-check matrix (e.g., from the bipartite graph) belongs to the independent set when the variable node is connected to only one check node from the independent set.

In addition to the size and conditions, the set of rules can also indicate how a permutation should be applied to the first parity-check matrix given the found independent set. For example, the set of rules defines a structure of the second-parity check matrix, similar to Equation 1 described in connection with FIG. 1, and parameters to permute the rows and columns of the first parity-check matrix to result in the structure. For instance, the set of rules specifies that the permutation should be applicable to the rows and columns form the first parity-check matrix and corresponding to the check nodes and variable nodes in the independent set such that the permutation results in the creation of an identity sub-matrix I in the top right corner of the second parity-check matrix.

The above and other information in the set of rules can be used to generate a search graph, apply a greedy algorithm, apply a find-method algorithm, and/or apply a hybrid search that relies on the search graph, the greedy algorithm, and the find-method algorithm.

At operation 306, the offline system generates the second parity-check matrix based on the independent set. In an example, the first parity-check matrix is the encoder-optimized parity check-matrix designed for the LDPC encoder, such as the parity check-matrix 112 of FIG. 1. The independent set includes pairs of check node and variable node. Each pair indicates a connection between the respective check node and variable node in the bipartite graph or, equivalently, a value of "1" in the intersection between the respective row and column of the first parity-check matrix. As such, the offline system identifies the rows and columns in the first parity-check matrix that should be permuted based on the pairs in the independent set. The offline system also identifies parameters for the permutation from the set of rules (e.g., a top right corner identity sub-matrix is desired). The permutation is then applied to the rows and columns of the first parity check matrix. The application of the permutation results in the second parity-check matrix. The structure of the second parity-check matrix follows Equation 1 described in connection with FIG. 1.

At operation 308, the offline system provides the second parity-check matrix to the encoder. For example, the offline system transmits the second parity-check matrix to the error correction system over a data network. In turn, the error correction system receives and stores this matrix in its local storage. Accordingly, the encoder has access to the second parity check-matrix from the local storage of the error correction system.

At operation 310, the error correction system encodes information bits based on the second-parity check matrix. For example, the information bits are received by the error correction system and provided to the encoder (e.g., an LDPC encoder). The encoder also accesses the second parity check matrix from the local storage and encodes the information bits as described in connection with FIG. 1 and equations 2 and 3.

At operation 312, the error correction system encodes information decodes the LDPC encoded bits. In the case of transmission of the LDPC encoded bits to another error correction system, the decoding may be performed at the other system. Regardless, in both cases the relevant decoder (e.g., an LDPC decoder) may decode the LDPC encoded bits. In an example, the LDPC decoder relies on the first parity-check matrix to decode the LDPC encoded bits. Because these bits are encoded based on the second parity-check matrix, and because this second matrix is a permutation of the first parity-check matrix, the decoding results in permuted bits. Accordingly, the decoder applies an inverse permutation to re-arrange the bits. In another example, the decoder relies instead on the second parity-check matrix for the decoding. In this example, no re-arrangement of the decoded bits is needed with respect to the permutation between the two matrices.

In the next figures, example original parity-check matrix H and example encoder-optimized parity check matrix H' are described to illustrate the search for and independent set and the generation of the example encoder-optimized parity check matrix H'. These two example matrices are provided for illustrative purposes. The embodiments of the present disclosure are not limited as such and, similarly, apply to other matrices (in size and/or values). In addition, a Tanner graph is described for illustrative purposes. The embodiments similarly apply to other types of bipartite graph.

The example original parity-check matrix H is a (3×4) matrix with the following values:

$$H = \begin{bmatrix} 1 & 0 & 0 & 1 \\ 1 & 1 & 1 & 0 \\ 0 & 0 & 1 & 1 \end{bmatrix}.$$

In this first matrix, the rows correspond to the check nodes and the columns correspond to the variable nodes. The value of a pair of check node and variable node $(c_i, v_j)$ is either "0" or "1." For example, the value of $(c_1, v_1)$ is "1" indicating a connection between these two nodes. In comparison, the value of $(c_1, v_2)$ is "0" indicating that no connection exist between $c_1$ and $v_2$.

The example encoder-optimized parity check matrix H' is:

$$H' = \begin{bmatrix} 1 & 1 & 1 & 0 \\ 0 & 1 & 0 & 1 \\ 0 & 0 & 1 & 0 \end{bmatrix}.$$

This second matrix H' is a permutation of the first matrix H, where the first column (corresponding to $v_1$) in the first matrix H is shifted to between the third column and fourth column (corresponding to $v_3$ and $v_4$, respectively). Once shifted, the first column from the first matrix H becomes the third column in the second matrix H'. Similarly, the first row (corresponding to $c_1$) in the first matrix H is shifted such that it becomes the last row in the second matrix H'. This permutation applied to the first matrix H results in the second matrix H' having a top right corner that defines a 2×2 identity sub-matrix I.

Figure 4:
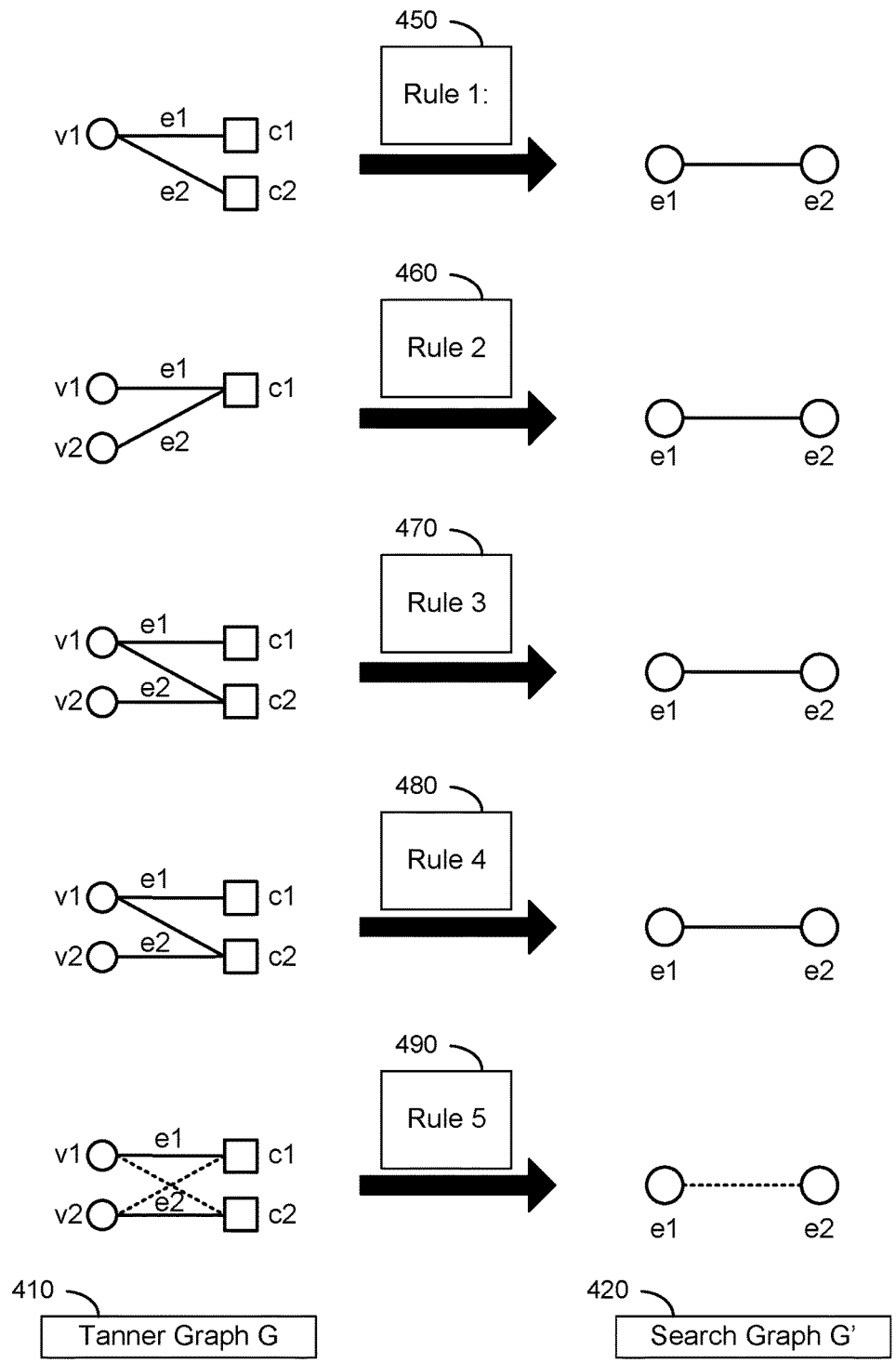
FIG. 4 illustrates an example set of rules for generating a search graph, in accordance with certain embodiments of the present disclosure.

FIG. 4 illustrates an example set of rules for generating a search graph. On the left hand side, building blocks 410 of a Tanner graph G are illustrated. On the right hand side, building blocks 420 of a search graph G' are illustrated. In between is the set of rules that transforms the Tanner graph building blocks 410 into the search graph building blocks 420.

Generally, The first parity-check matrix H describes the Tanner graph G=((V∪C), E), where V, C, and E are the set of variable nodes, check nodes and the edges respectively, such that $H_{ij}=1$ if $(c_i, v_j) \in E$ (e.g., check node $c_i$ connects to variable node $v_j$). In comparison, the search graph G' defines a set of vertices that represent edges of the Tanner graph G and that are connected based on the set of rules.

Specifically, a first rule 450 specifies that two vertices v' in the search graph G' are connected in the search graph G' when two corresponding edges e from the Tanner graph G share a same check node c. A second rule 460 specifies that two vertices v' in the search graph G' are connected in the search graph G' when two corresponding edges e from the Tanner graph G share a same variable node v. A third rule 470 specifies that two vertices v' in the search graph G' are connected in the search graph G' when each of the two corresponding edges e from the Tanner graph G is connected to a different check node c and when the two corresponding edges e from the Tanner graph G are connected to a same variable node v. A fourth rule 480 specifies that two vertices v' in the search graph G' are connected in the search graph G' when each of the two corresponding edges e from the Tanner graph G is connected to a different variable node v and when the two corresponding edges e from the Tanner graph G are connected to a same check node c. A fifth rule 490 may specify that, otherwise, no connection may exist between two vertices v' of the search graph G'.

In an example, the above set of rules can be expressed as:

The search graph $G' = (V', E')$, where $V' = E$ and $$E' = \begin{cases} (e_1, e_2) \in E \times E: e_1 \neq e_2. \text{ Also, one of the following must hold:} \\ \quad v(e_1) = v(e_2), \text{ or} \\ \quad c(e_1) = c(e_2), \text{ or} \\ \quad (c(e_1), v(e_2)) \in E, \text{ or} \\ \quad (c(e_2), v(e_1)) \in E \end{cases}.$$

Figure 5:
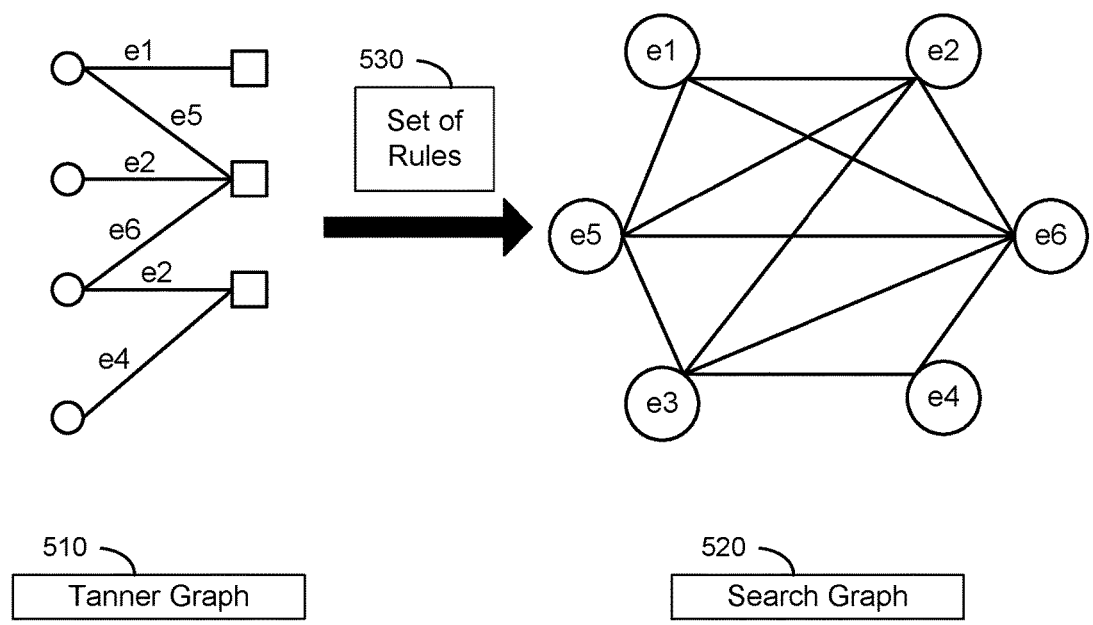
FIG. 5 illustrates an application of a set of rules to generate a search graph from a Tanner graph, in accordance with certain embodiments of the present disclosure.

FIG. 5 illustrates an application of a set of rules 530 to generate a search graph 520 from a Tanner graph 510. The set of rules 530 includes the rules 450-490 described in connection with FIG. 4. Each circle on the left hand side of the Tanner graph 510 represents a variable node v. Each square on the right hand side of the Tanner graph 510 represents a check node c. Each line that connects a circle to a square in the Tanner graph 510 represents an edge e. In comparison, each circle in the search graph 520 represents a vertex v' and corresponds to an edge e from the Tanner graph 510. Each line in the search graph 520 represents a connection between two vertices c (conversely, between two edges e) based on the set of rules 530.

As illustrated, $c_1$ and $v_1$ in the Tanner graph 510 are connected via an edge $e_1$. In the search graph 520, $e_1$ is represented with a vertex $v'_1$. Similarly, $e_2$ is represented as $v'_2$ and corresponds to an edge between $c_2$ and $v_2$. Based on the set of rules 530, $v'_1$ and $v'_2$ are also connected (specifically because of the third rule 470). This process of representing the edges as vertices v' and of connecting the vertices v' based on the set of rules 530 is repeated exhaustively across the Tanner graph 510 and results in the search graph 520.

Figure 6:
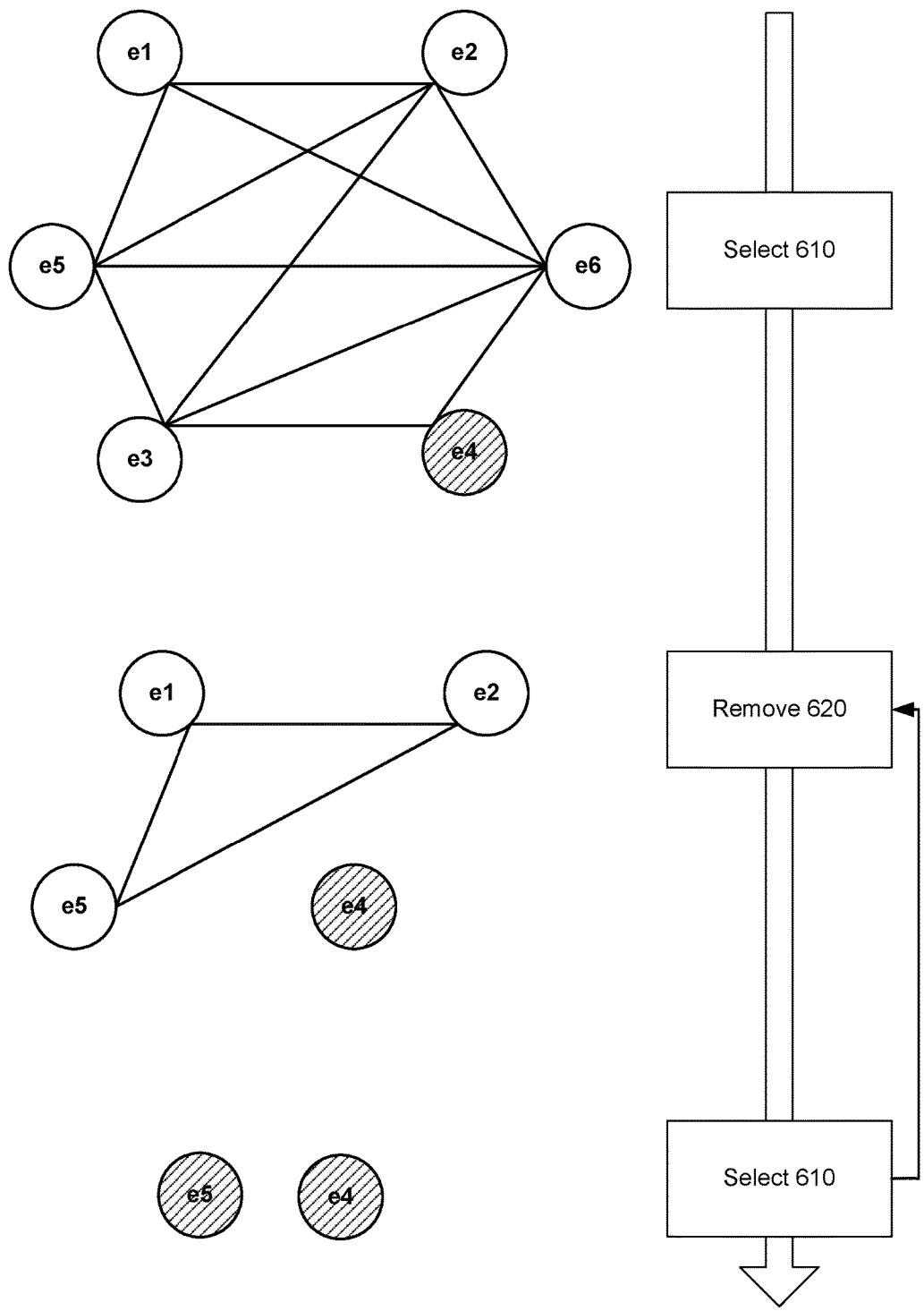
FIG. 6 illustrates an application of a greedy algorithm to identify vertices from a search graph, where the vertices are used to create an independent set of check nodes and variable nodes, in accordance with certain embodiments of the present disclosure.

FIG. 6 illustrates an application of a greedy algorithm to identify vertices from a search graph, where the vertices are used to create an independent set of check nodes and variable nodes. The illustrated search graph corresponds to the search graph 520 described in connection with FIG. 5.

In a first step, a vertex is selected 610 according to a set of rules. The set of rules defines the parameters of the greedy algorithm to search for the independent set. For example, the set of rules specifies that the vertex with the least degree (e.g., fewest connections connected to it) should be selected. If more than one vertex have the least degree, one of such vertices should be selected randomly. Accordingly, $v'_4$ (that represents $e_4$) is selected for having the least degree of the two.

In a next step, vertices connected to the selected vertex are removed 620 according to the set of rules. In the illustrated example, vertices $v'_3$ and $v'_6$ (that represent $e_3$ and $e_6$) are removed. Vertices $v'_1$, $v'_2$, and $v'_5$ remain. Each now has the same degree of two.

The selection and removal process are iteratively repeated until the search graph is empty (e.g., no vertex remains to be selected or removed). Specific to the search graph of FIG. 6, the next select 610 and remove 620 result in randomly selecting any of the vertices $v'_1$, $v'_2$, or $v'_5$ (each having a degree of two), illustrated as the random selection of $v'_5$ (that represent $e_5$).

Accordingly, the application of the greedy algorithm results in the selection of the two vertices $v'_4$ and $v'_5$. This selection can be translated back to two pairs of check node and variable node based on the equivalent edges $e_4$ and $e_3$. Specifically, $e_4$ connects $v_4$ and $c_3$ in the Tanner graph 510. Accordingly, the independent set includes the pair $(c_3, v_4)$. Similarly, $e_3$ connects $v_1$ and $c_2$ in the Tanner graph 510. Accordingly, the independent set also includes the pair $(c_2, v_1)$. In an example, the independent set can include additionally or alternatively the selected vertices v' or edges e (e.g., the independent set is $\{e_4, e_3\}$ for the illustrative example of FIG. 6).

This search for the independent set by applying a greedy algorithm to a search graph can be more generally defined as following. For an original parity-check matrix H, any identity sub-matrix I that can be obtained by row/column permutations is equivalent to an independent set of the corresponding search graph G'. An independent set is a subset of the nodes in the graph, denoted by $T \subseteq V'$, such that $\forall e, e' \in T, (e, e') \notin E'$. The maximum independent set of a graph is the independent set of the largest possible size.

By the equivalence of identity sub-matrices and independent sets, the search for the independent set can be defined as an optimization problem to find a maximum independent set for the search graph corresponding to the original parity-check matrix H.

Finding the maximum independent set for a general graph is a NP-hard problem, where the complexity to solve this problem optimally can grow exponentially with the size of the graph. Instead, the greedy algorithm can be applied to solve the problem sub-optimally. The application starts with the search graph G'. The vertex with the least degree is selected and added to the independent set (or the corresponding pair of check node and variable node is additionally or alternatively added). The selected vertex, its neighboring vertices and their edges are removed from the graph. This process is repeated till no vertices remain in the search graph.

Once the independent set is found, a permutation can be derived therefrom and applied to the original parity-check matrix H to generate the encoder-optimized parity-check matrix H'. In an example applicable to the matrix structure created according to Equation 1, the permutation can be defined as following. Given an independent set $T \subseteq E$, let:

$$V_{ind} = \{v(e) \forall e \in T\} \subseteq V,$$

$$C_{ind} = \{C(e) \forall e \in T\} \subseteq C, \text{ and}$$

$$k_1 = |V_{ind}| = |C_{ind}|.$$

Then the encoder-optimized parity check matrix H' is given by the following steps:

1. variable nodes in $V \backslash V_{ind}$ are permuted to positions $\{1, 2, \ldots, n-k_1\}$ and variable nodes in $V_{ind}$ are permuted to positions $\{n-k_1+1, \ldots, n\}$, and 2. check nodes in $C_{ind}$ are permuted to positions $\{1, 2, \ldots, k_1\}$ and check nodes in $C \backslash C_{ind}$ are permuted to positions $\{k_1+1, \ldots, n-k\}$.

Figure 7:
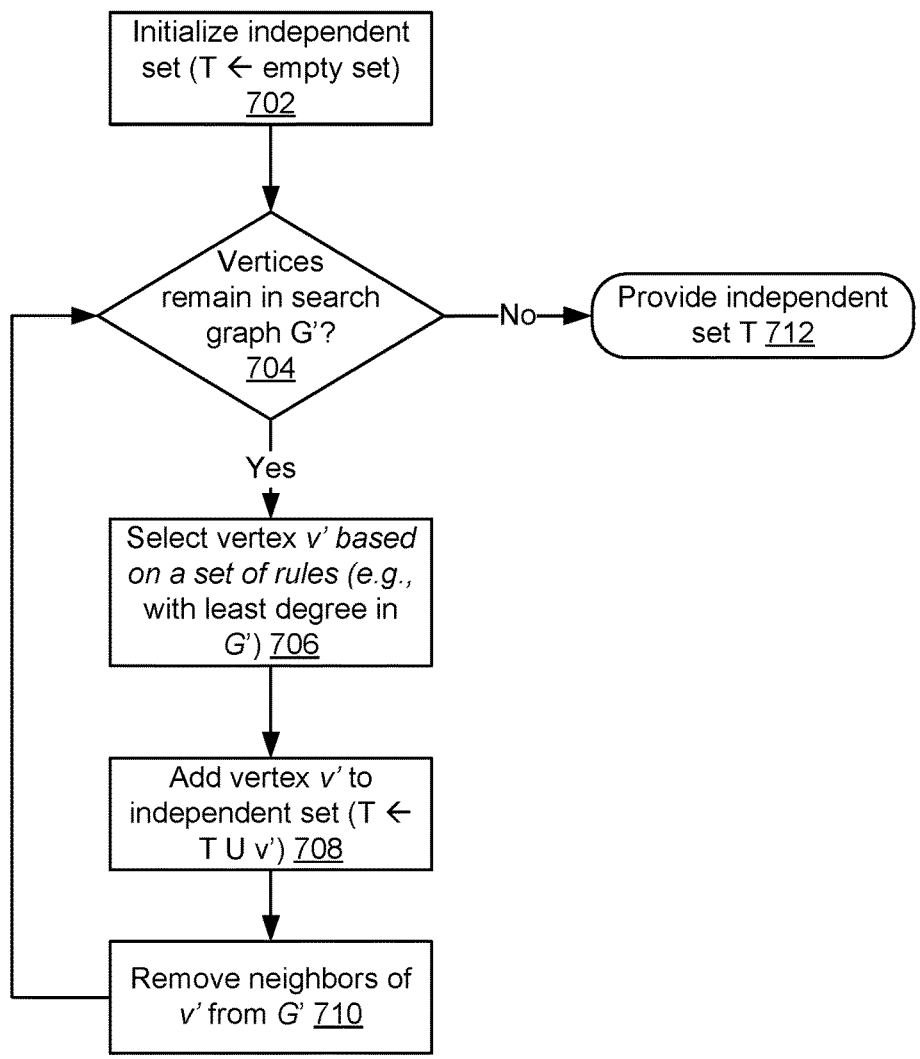
FIG. 7 illustrates an example flow for applying a greedy algorithm to a search graph to find an independent set, in accordance with certain embodiments of the present disclosure.

FIG. 7 illustrates an example flow 700 for applying a greedy algorithm to a search graph G' and find an independent set T In an example, the independent set T is the maximum independent set. An offline system, such as the offline system described in connection with FIG. 3, can perform the operations of the example flow 700.

The flow 700 starts at operation 702, where the offline system initializes the independent set T For example, the independent set T is set to being empty (e.g., T={ }).

At operation 704, the offline system determines whether any vertices v' remain in the search graph G'. Initially, the search graph is not empty. Therefore, multiple vertices v' are available for selection and operation 706 is performed. However, after one or more iterations of selections and removal, no vertex v' may remain. Accordingly, operation 712 is performed to provider the independent set T At operation 706, one or more vertices v' are available for selection. The selection can occur according to a set of rules, such as the set of rules 530 described in connection with FIG. 5. Thus, the offline system selects a particular vertex v' in the search graph G' based on the set of rules. If only one vertex v' remain at the start of operation 716, that vertex v' is selected. Otherwise, multiple vertices v' are available and at least one of them has a number connections to one or more other vertices v'. In this case, the offline system selects, for example, the vertex v' with the least degree. If more than one of such vertices v' exist, the offline system selects one of them randomly.

At operation 708, the offline system adds the a particular vertex v' (the one that was selected) to the independent set T In this operation, the independent set includes a set of vertices. However, and as explained herein above, other implementations of the independent set T are possible. For example, the independent set T can additionally or alternatively store edges or pairs of check node and variable node. In this case, the offline system identifies the particular edge and/or the particular pair that corresponds to the particular vertex v' based on the search graph G' and/or the Tanner graph G for addition to the independent set T.

At operation 710, the offline system removes neighbors of the particular vertex v' from the search graph G'. In an example, a neighbor is defined as another vertex v' having a connection to the particular vertex v'. Accordingly, the offline system removes one or more other vertices from the search graph G', where each of such vertices v' is connected to the particular vertex v'.

The use of a greedy algorithm in conjunction with a search graph represents a sub-optimal solution to the optimization problem of searching for an independent set (e.g., a maximum independent set). Other approaches are possible to search for the most optimal solution. One example approach implements a Find-Matching algorithm as described in the next figure. The algorithm takes as input a subset of the check nodes (denoted as candidate sets) and the original parity-check matrix H. From the corresponding search graph, it then finds an independent set that will include exactly one edge for each check node in the given subset. If no such independent set exists, the algorithm returns an empty set.

The Find-Matching algorithm has low computational complexity. Therefore, by using this algorithm, it is possible to test all possible subsets of the check nodes of a given size to exhaustively find the independent size of the largest size.

Figure 8:
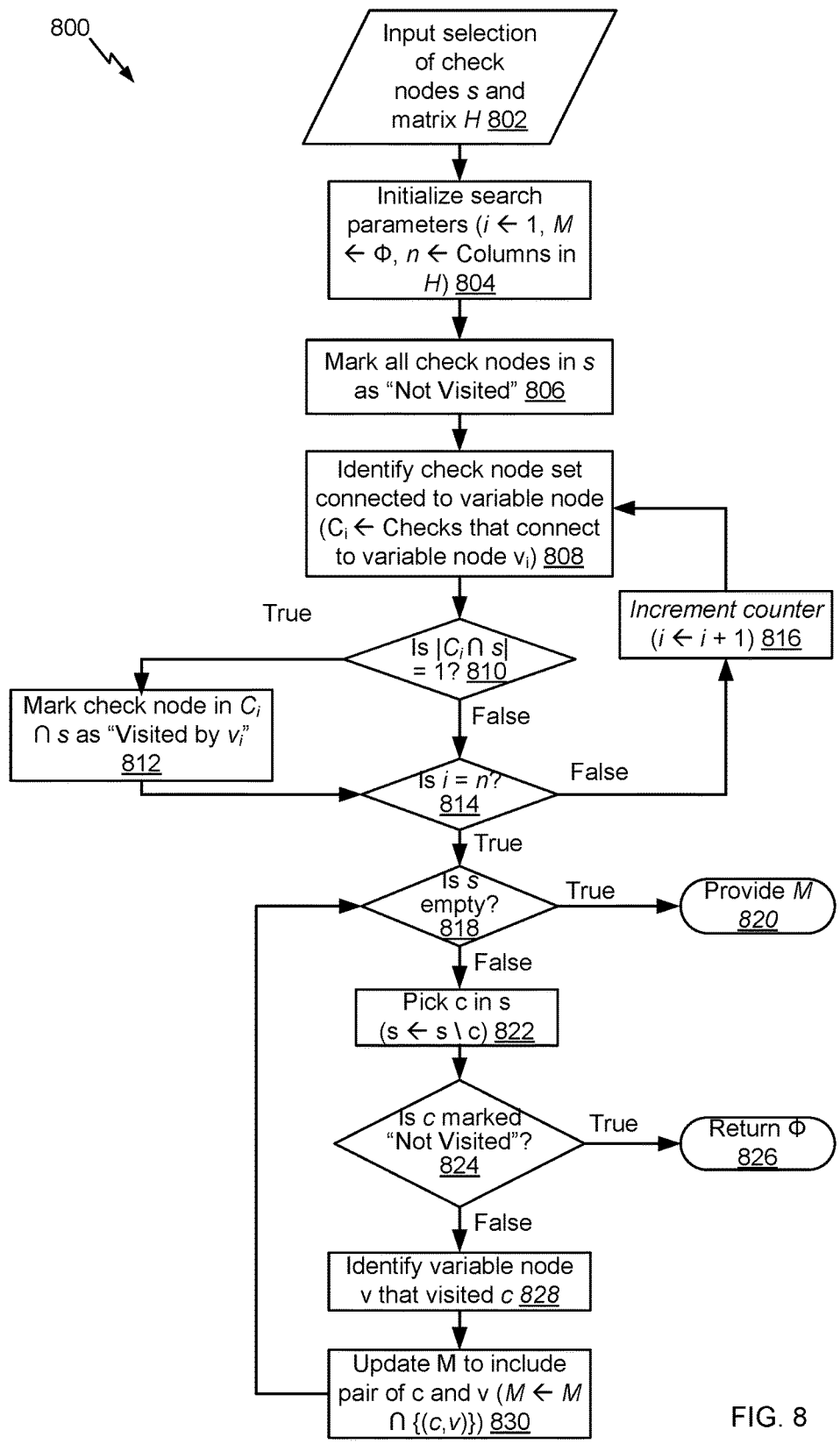
FIG. 8 illustrates an example flow for applying a Find-Matching algorithm to find an independent set, in accordance with certain embodiments of the present disclosure.

FIG. 8 illustrates an example flow 800 for applying a Find-Matching algorithm to find an independent set. In an example, the independent set M is the maximum independent set. An offline system, such as the offline system described in connection with FIG. 3, can perform the operations of the example flow 800. Whereas the example flow 700 of FIG. 7 illustrates an independent set T that includes vertices v' from a search graph G', the independent set M of FIG. 8 includes pairs of check node and variable node. That is to illustrate that the Find-Matching algorithm need not rely on or involve a search graph G' to output an independent set M. However, a similar independent set T can also be derived if a search graph is defined.

The flow 800 starts at operation 802, where the offline system inputs a selection of candidate set s of check nodes and the original parity-check matrix H. The matrix H can be available from local storage of the offline system. The check nodes in the candidate set s collectively represent a subset of the check nodes c of the Tanner graph G and are candidate check nodes that can be added to the independent set M Through a number of iterative operations, these candidates are examined to determine whether any or all should be added to the independent set M.

Various techniques are available for the selection of the candidate sets and can be identified in a set of rules. In one example selection technique, the check nodes are randomly selected. In another example selection technique, the check nodes are selected in a top-down approach, where if "k" is the number of all check nodes c (or, equivalently, rows in the original parity-check matrix H), the size of the candidate sets is set as "k−1." In this example and as further described in the next operations of the flow 800, the search for the independent set M is iterative and the size of the candidate set is iteratively decreased until the independent set M is found (e.g., until the maximum independent set is found or an independent set that has a size greater than a predefined size threshold). In yet another example selection technique, the search is from the bottom to the top. The bottom can be set as "1" and the size of the candidate sets can be iteratively increased. Alternatively in this example, the bottom can be set as an output of the greedy algorithm described in connection with FIG. 7. More specifically, a hybrid approach can be used, where the independent set outputted from the flow 700 can be used to set the bottom. This outputted independent set includes check nodes. These check nodes are set as the candidate set s. From that point, the search moves iteratively upward by iteratively increasing the size of the candidate sets until the maximum independent set M is found or the size threshold is met or exceeded, or until a number of iterations is met (e.g., the number of iterations meeting or exceeding a predefined number threshold). In a further example selection technique, the selection involves a binary search. In particular, the initial size of the candidate sets is set as half of "k" (e.g., half of the number of rows). The search for the independent set is performed. If the desired independent set is found (e.g., the maximum or one having a size meeting or exceeding the size threshold), the search ends. Otherwise, the initial size is increased by a forth of "k" and so on and so forth until the desired independent set M is found.

At operation 804, the offline system initializes the search parameters. For example, a counter i is set to 1. The independent set M is empty. And the number "n" of columns of the original parity-check matrix H is identified.

At operation 806, the offline system marks all check nodes in the candidate set s as not visited. For example, a Boolean integer can be mapped to each of such check nodes. The value of the Boolean integer (e.g., a "0") indicate the "not visited" state.

At operation 808, the offline system selects the variable node $v_i$ from the Tanner graph G. For that variable node $v_i$, the offline system identifies from the Tanner graphs G all of the particular check nodes connected to $v_i$. The offline system forms a connected set $C_i$ of check nodes by adding these particular check nodes to this connected set $C_i$. In other words, the variable node $v_i$ is connected to each check node in the connected set $C_i$.

At operation 810, the offline system determines whether a size of an intersection between the candidate sets and the connected set $C_i$ is equal to one. If so, operation 812 is performed. Otherwise, operation 814 is performed.

At operation 812, the offline system marks a check node corresponding to the intersection between the two sets as being visited by (or, more broadly, being associated with) the variable node $v_i$. This indicates that the particular intersecting check node belongs to the candidate set s (and the connected set $C_i$) and is connected to the variable node $v_i$ in the Tanner graph G. For example, the respective Boolean integer is updated (e.g., set to "1").

At operation 814, the offline system determines if the counter i has reached the number of columns "n." If not, operation 816 is performed, where the offline system increments the counter i by one and iteratively repeats the operations 808-814. If the if the counter i has reached the number of columns "n," operation 818 is performed.

At operation 818, the offline system determines whether the candidate set s is empty. Initially, this set is not empty and includes the candidate check nodes that were selected as described in connection with the operation 802. Through multiple search iterations as illustrated in the next operations, the candidate check nodes are removed from the candidate set s until it becomes empty. At the point, operation 820 is performed, where the offline system provides the independent set M. Otherwise, operation 822 is performed.

At operation 822, the offline system picks a candidate check node c in the candidate set s. The picking includes selecting and removing the candidate check node c from the candidate set s. The selection can be random or can follow a particular order (e.g., an increasing order).

At operation 824, the offline system determines whether the candidate check node c was marked as being associated with (e.g., visited by) or as being unassociated with (e.g., not visited by) a variable node v. For example, the value of the respective Boolean integer is used for this determination. If so, operation 826 is performed, where an empty value is returned (e.g., a no result). Otherwise, operation 828 is performed.

At operation 828, the offline system identifies the variable node v that is connected to the candidate check node c. The Tanner graph G is used for this identification. If multiple variable nodes v are connected, one of them can be randomly selected. Hence, a pair of check node and variable node is identified, where the pair includes the candidate check node c and the connected variable node v.

At operation 830, the offline system updates the independent set M by adding the pair to the independent set M. At this stage, the independent set M represents a potential independent set. Operation 818 is performed after the operation 830 such that the potential independent set is iteratively updated (and, thus, its size increased) by adding, as applicable, additional pairs of check node and variable node until the candidate sets becomes empty at operation 818. At that point, the offline systems sets the potential independent set as the independent set M and provides the independent set M in connection with the operation 820.

Depending on the selection technique described in connection with operation 802, the generated independent set M may be a maximum independent set or one having a size equal or greater than a predefined size threshold. That can be the case when a top-down approach is used. Otherwise, the selection is repeated (e.g., the next size up of the candidate sets is selected) and the search for the independent set is performed again. Hence, in this iterative search, if a next independent set is found and has a larger size, the previous one is discarded and the next one is used and so on and so forth until the desired independent set is found.

Although FIG. 8 describes the selection and use of a candidate set s of check nodes, a candidate set of variable nodes can be used instead. Specifically, the operations 802-830 are performed in a similar way by substituting the check nodes with the variable nodes. However, in this case, the computation to find the independent set M can increase because there are a relatively larger number of variable nodes (and possible combinations thereof) than check nodes.

Any of the above flows can be also adapted to QC-LDPC. More specifically, the two parity-check matrices H and H' are QC-LDPC parity-check matrices. Out of the original QC-LDPC parity-check matrix, an offline system generates an intermediary LDPC parity-check matrix. For example, the circulant submatrices are substituted with protograph representations in the intermediary LDPC parity-check matrix. For example, a circulant submatrix with all zeros is substituted with a "0." Otherwise, it is substituted with a "1." Thereafter, the offline system applies any or a combination of the example flows 700 and 800 and the applicable set of rules to the intermediary LDPC parity-check matrix to generate a second intermediary LDPC parity-check matrix. Once the second is generated, the offline system expands it into the second QC-LDPC parity-check matrix to include the circulant submatrices by substituting, in the second intermediary LDPC parity-check matrix, the protograph representations with the respective circulant submatrices.

More specifically, for QC-LDPC codes, the parity-check matrix is a block matrix of circulant permutation matrices. Such a matrix can be described by a protograph matrix, which is obtained by replacing the non-zero circulant permutation matrices in the parity-check matrix by "1" and the all-zero circulant matrices by "0," as well as by an array of the shifts in each circulant permutation matrix. Such a structure in the parity-check matrix makes decoding implementations simpler and is desirable in final parity-check matrix used for encoding as well.

In an example, the quasi-cyclic property can be achieved in the encoder-optimized parity-check matrix H' as follows. First, the protograph matrix of the original parity-check matrix H is found (denoted by Proto(H)). Next, any of the techniques and flows are applied to get an independent set. The protograph matrix is permuted and then the circulant matrices in the original parity-check matrix H are replaced back into the permuted protograph matrix.

Since the protograph matrix is typically a few orders of magnitude smaller than the original parity-check matrix H, it is easier to find the optimal solution using the method described herein.

Figure 9:
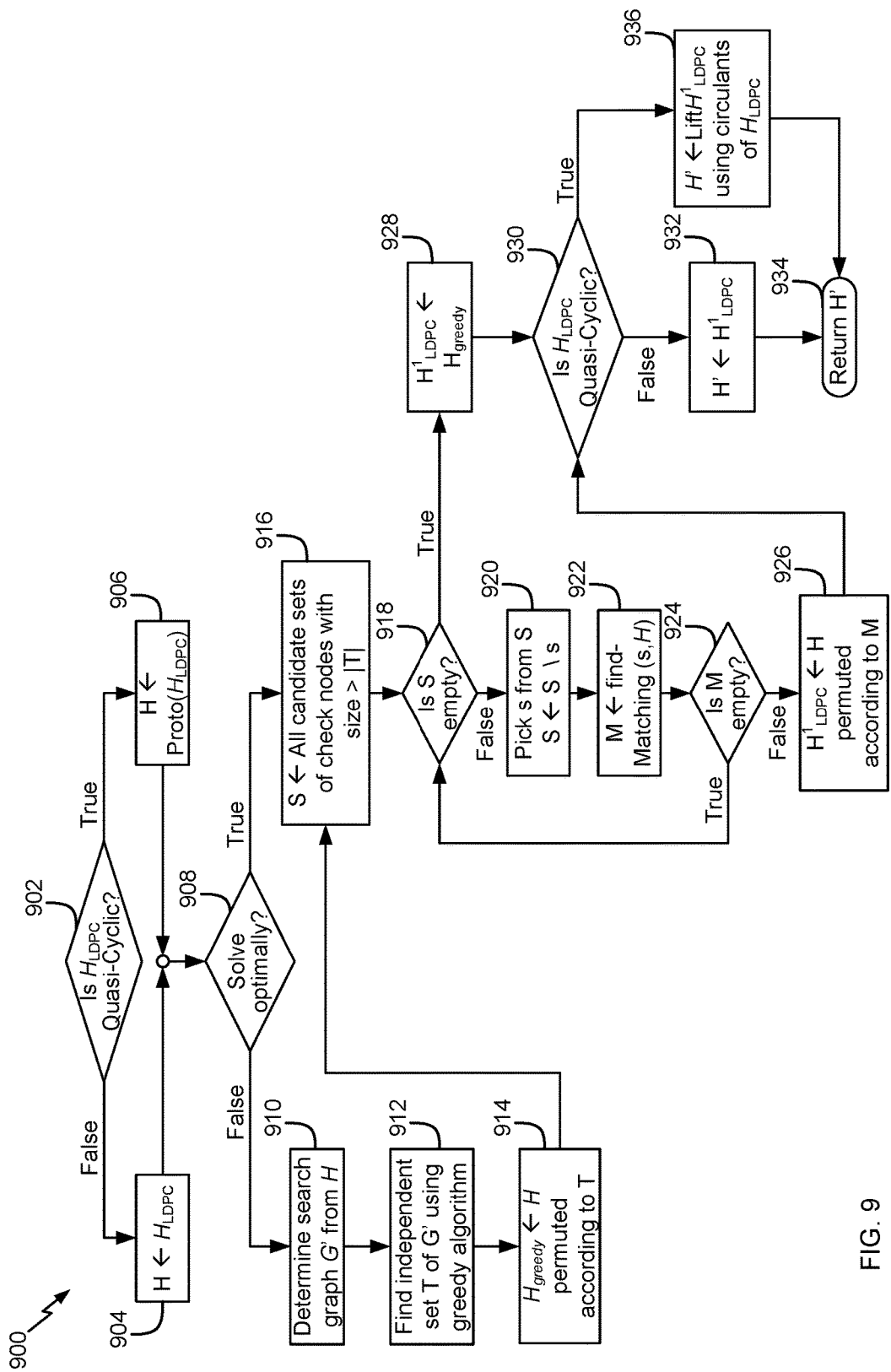
FIG. 9 illustrates an example flow of generating an encoder-optimized QC-LDPC parity check matrix H' from an original QC-LDPC parity-check matrix H, in accordance with certain embodiments of the present disclosure.

FIG. 9 illustrates an example flow 900 of generating an encoder-optimized QC-LDPC parity check matrix H' from an original QC-LDPC parity-check matrix H. An offline system, such as the offline system described in connection with FIG. 3, can perform the operations of the example flow 900. The example flow includes an application of both a search graph/greedy algorithm and a Find-matching algorithm. However, the use of one of such search techniques can also be implemented. The operations of the example flow 900 described in connection with both search techniques are similar to the operations of the example flows 700 and 800. In the interest of clarity of explanation, the similarities are not repeated herein. For the purpose FIG. 9, an LDPC parity-check matrix denotes a non-QC-LDPC parity-check matrix, although QC-LDPC code is a type of LDPC code.

The flow 900 starts at operation 902, where the offline system determines whether an original parity-check matrix is an LDPC parity-check matrix or a QC-LDPC parity check matrix. For example, the original parity-check matrix has metadata that describes whether it is designed for QC-LDPC code or not. In another example, the structure and values of the original parity-check matrix are analyzed to make the determination. If the determination is for the LDPC parity-check matrix, operation 904 is performed. Otherwise, operation 906 is performed.

At operation 904, the offline system sets the LDPC parity-check matrix as the parity check matrix H for analysis. In comparison, at operation 906, the offline system generates an intermediary LDPC parity-check matrix (or, equivalently, a protograph matrix) from the QC-LDPC parity check-matrix and sets the intermediary LDPC parity-check matrix as the parity check matrix H for the analysis. From this point on, the analysis is the same (up to operation 930) regardless of the type of original parity-check matrix.

At operation 908, the offline system determines whether to search for the optimal solution. For instance, this decision can be made based on the computational burden to derive the optimal solution relative to the available computational resources of the offline system and/or based on user input of an operator of the offline system. If a potentially sub-optimal solution is acceptable, operation 910 is performed to initiate a search graph/greedy algorithm approach. Otherwise, operation 916 is performed to initiate a find-matching algorithm approach.

At operation 910, the offline system determines a search graph G' from the parity check matrix H. The search graph can be generated as described in connection with FIGS. 4-6.

At operation 912, the offline system finds the independent set T of the search graph G' using the greedy algorithm, as described in connection with FIG. 7. In an example, the independent set T includes a set of edges e found from the search graph.

At operation 914, the offline system permutes the parity-check matrix H according to the independent set T to generate a permuted parity-check matrix H". The permutation can apply a set of rules to re-arrange the columns and rows such that an identity sub-matrix is formed.

At operation 916, the application of the find-matching algorithm commences. If the independent set T is provided as an input, then a hybrid search approach is used. More specifically, the size of the independent set T is set as the initial size of a candidate sets of check nodes. Accordingly, at operation 916, all candidate sets (collectively shown in FIG. 9 as a set 5) having a size greater than the size of the independent set T are generated and used to find a more optimal independent set M (if one exists).

At operation 918, the offline system determines whether all of the candidate sets s are empty (e.g., no candidate sets has a size larger than that of the independent set T exists). If so, operation 920 is performed to search for the more optimal independent set M. Otherwise, operation 928 is performed, where the optimal independent set (e.g., the maximum independent set) is simply the independent set T.

If that is the case, the permuted parity-check matrix H" is set as the encoder-optimized parity-check matrix H'. Operation 930 is then performed following operation 928.

At operation 920, the offline system picks (e.g., selects and removes) a candidate set s from the subset S of all candidate sets. The selection can be random or can depend on a size strategy (e.g., start with the largest possible and decrease, with the smallest possible and increase, or perform a binary search by varying the sizes).

At operation 922, the offline system applies the find-matching algorithm based on the selected candidate set s and the parity-check matrix H as illustrated in connection with the flow 800 of FIG. 8. The application results in an independent set M.

At operation 924, the offline system determines whether the independent set M is empty. If so, the operation 918 is looped back to further (e.g. iteratively) search for another independent set M or to use the independent set T. Otherwise, operation 926 is performed.

At operation 926, the offline system permutes the parity-check matrix H according to the independent set M to generate a permuted parity-check matrix H". The permutation can apply a set of rules to re-arrange the columns and rows such that an identity sub-matrix is formed. Operation 930 is then performed after operation 926.

At operation 930, the search for the optimal independent set has already been completed (whether it is the independent set T or the independent set M) and a permuted parity-check matrix H" has already been generated (whether at operation 928 based on the independent set T or at operation 926 based on the independent set M). Accordingly, the offline system determines again (or keeps track of the determination at operation 902) whether the original parity-check matrix is an LDPC parity-check matrix or a QC-LDPC parity check matrix. If the determination is for the LDPC parity-check matrix, operation 932 is performed. Otherwise, operation 936 is performed.

At operation 932, the offline system sets the permuted parity-check matrix H" as the encoder-optimized parity check matrix H. At operation 934, the offline system provides (e.g., stores to local storage to transmit to another system or to remote storage) the encoder-optimized parity check matrix H'.

At operation 936, the offline system expands the permuted parity-check matrix H" to include the circulant submatrices, thereby creating an encoder-optimized QC-LDPC parity-check matrix.

Next, a complexity analysis of the above QC-LDPC approach is described. The number of rows and columns in the original QC-LDPC parity-check matrix are represented by $N_c$ and $N_v$, respectively. Let the circulant size be c and the number of non-zero elements in each row and column be at most $d_c$ and $d_v$, respectively.

The time complexity for the greedy algorithm for finding an independent set of the corresponding search graph is:

$$O\left(\frac{N_v d_v}{c}\right).$$

The space complexity for the greedy algorithm is:

$$O\left(\frac{N_v d_v}{c} \times (d_v + d_c - 2) \times \log\left(\frac{N_v d_v}{c}\right)\right).$$

Let the size of the candidate set of check nodes for the Find-Matching algorithm be $N_s$. Then the time complexity of Find-Matching algorithm is:

$$O\left(\frac{N_v d_v N_s}{c}\right).$$

The time complexity of running Find-Matching for all possible subsets of the check nodes (to find the maximum independent set without any lower bound) is:

$$O\left(\frac{N_v d_v}{c} \times \frac{N_c}{c} \times 2^{\frac{N_c}{c}}\right).$$

The space complexity of the Find-Matching algorithm is:

$$O\left(\frac{N_c}{c} \times \log\left(\frac{N_v}{c}\right)\right).$$

Thus, the complexity of the proposed algorithms is low for QC-LDPC codes with a moderate circulant size c.

In this disclosure, methods to transform a given LDPC parity-check matrix are described so that this matrix meets the structure preferred by an efficient encoder. The methods do not affect decoding performance and improve the encoder implementation and complexity significantly. In one embodiment, the proposed methods work by transforming the problem of finding the preferred row/column permutations into the problem of finding an independent set of a graph constructed from the parity check matrix. The proposed methods can maintain the quasi-cyclic property of the parity-check matrix and provide significant gains in the encoder for QC-LDPC codes.

Figure 10:
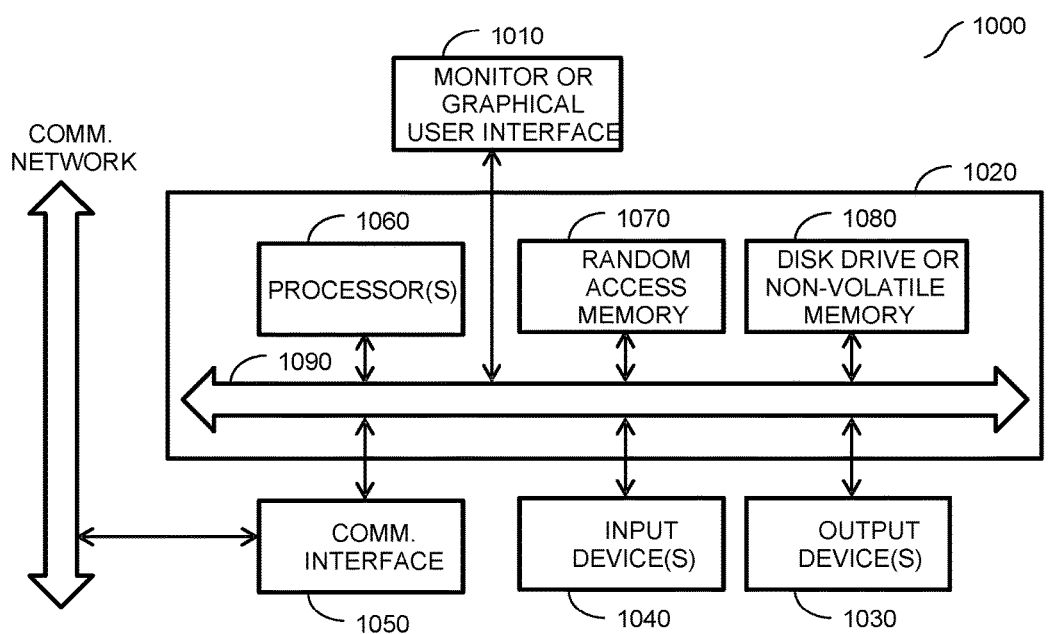
FIG. 10 describes one potential implementation of a system which may be used, according to one embodiment.

FIG. 10 describes one potential implementation of a system which may be used, according to certain embodiments. FIG. 10 is merely illustrative of an embodiment of the present disclosure and does not limit the scope of the disclosure as recited in the claims. In one embodiment, the system is a computer system 1000 that typically includes a monitor 1010, a computer 1020, user output devices 1030, user input devices 1040, communications interface 1050, and the like.

As shown in FIG. 10, the computer 1020 may include a processor(s) 1060 that communicates with a number of peripheral devices via a bus subsystem 1090. These peripheral devices may include the user output devices 1030, the user input devices 1040, the communications interface 1050, and a storage subsystem, such as random access memory (RAM) 1070 and disk drive 1080.

The user input devices 1030 include all possible types of devices and mechanisms for inputting information to the computer system 1020. These may include a keyboard, a keypad, a touch screen incorporated into the display, audio input devices such as voice recognition systems, microphones, and other types of input devices. In various embodiments, the user input devices 1030 are typically embodied as a computer mouse, a trackball, a track pad, a joystick, wireless remote, drawing tablet, voice command system, eye tracking system, and the like. The user input devices 1030 typically allow a user to select objects, icons, text and the like that appear on the monitor 1010 via a command such as a click of a button or the like.

The user output devices 1040 include all possible types of devices and mechanisms for outputting information from the computer 1020. These may include a display (e.g., the monitor 1010), non-visual displays such as audio output devices, etc.

The communications interface 1050 provides an interface to other communication networks and devices. The communications interface 1050 may serve as an interface for receiving data from and transmitting data to other systems. Embodiments of the communications interface 1050 typically include an Ethernet card, a modem (telephone, satellite, cable, ISDN), (asynchronous) digital subscriber line (DSL) unit, FireWire interface, USB interface, and the like. For example, the communications interface 1050 may be coupled to a computer network, to a FireWire bus, or the like. In other embodiments, the communications interfaces 1050 may be physically integrated on the motherboard of the computer 1020, and may be a software program, such as soft DSL, or the like.

In various embodiments, the computer system 1000 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 1020 includes one or more Xeon microprocessors from Intel as the processor(s) 1060. Further, one embodiment, the computer 1020 includes a UNIX-based operating system.

The RAM 1070 and the disk drive 1080 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 1070 and the disk drive 1080 may be configured to store the basic programming and data constructs that provide the functionality of the present disclosure.

Software code modules and instructions that provide the functionality of the present disclosure may be stored in the RAM 1070 and the disk drive 1080. These software modules may be executed by the processor(s) 1060. The RAM 1070 and the disk drive 1080 may also provide a repository for storing data used in accordance with the present disclosure.

The RAM 1070 and the disk drive 1080 may include a number of memories including a main random access memory (RAM) for storage of instructions and data during program execution and a read only memory (ROM) in which fixed non-transitory instructions are stored. The RAM 1070 and the disk drive 1080 may include a file storage subsystem providing persistent (non-volatile) storage for program and data files. The RAM 1070 and the disk drive 1080 may also include removable storage systems, such as removable flash memory.

The bus subsystem 1090 provides a mechanism for letting the various components and subsystems of the computer 1020 communicate with each other as intended. Although the bus subsystem 1090 is shown schematically as a single bus, alternative embodiments of the bus subsystem may utilize multiple busses.

FIG. 10 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A computer-implemented method of generating a parity-check matrix for a low density parity-check (LDPC) encoder, the computer-implemented method comprising:
    accessing, by a computer system, a first parity-check matrix defined for an LDPC decoder;

determining, by the computer system and based on a set of rules, an independent set of check nodes and variable nodes associated with the first parity-check matrix, wherein:
the set of rules specifies that a check node associated with the first parity-check matrix belongs to the independent set when the check node is connected to only one variable node from the independent set,
the set of rules further specifies that a variable node associated with the first parity-check matrix belongs to the independent set when the variable node is connected to only one check node from the independent set, and
a size of the independent set is based on the set of rules; and
generating, by the computer system, a second parity-check matrix by at least applying a permutation to the first parity-check matrix based on the independent set, wherein the LDPC encoder is configured to encode bits based on the second parity-check matrix for decoding by the LDPC decoder.

2. The computer-implemented method of claim 1, wherein generating the second matrix comprises:
generating, by the computer system, an independent matrix based on the independent set of check nodes and variable nodes; and
permuting, by the computer system, rows and columns from the first parity-check matrix to define an arrangement of the rows and the columns that comprises the independent matrix, wherein the second parity-check matrix comprises the arrangement of the rows and the columns.

3. The computer-implemented method of claim 2, wherein the independent matrix is the largest independent matrix available from the first parity-check matrix.

4. The computer-implemented method of claim 1, wherein determining the independent set of check nodes and variable nodes is based on a search graph, and further comprising generating, by the computer system, the search graph by at least:
setting, as a vertex in the search graph, an edge from a bipartite graph corresponding to the first parity-check matrix, wherein the edge connects a pair of check node and variable node in the bipartite graph; and
connecting vertices in the search graph based on the set of rules.

5. The computer-implemented method of claim 4, wherein the set of rules specifies that two vertices in the search graph are connected in the search graph when two corresponding edges from the bipartite graph share a same check node.

6. The computer-implemented method of claim 4, wherein the set of rules specifies that two vertices in the search graph are connected in the search graph when two corresponding edges from the bipartite graph share a same variable node.

7. The computer-implemented method of claim 4, wherein the set of rules specifies that two vertices in the search graph are connected in the search graph when each of the two corresponding edges from the bipartite graph is connected to a different check node and when the two corresponding edges from the bipartite graph are connected to a same variable node.

8. The computer-implemented method of claim 4, wherein the set of rules specifies that two vertices in the search graph are connected in the search graph when each of the two corresponding edges from the bipartite graph is connected to a different variable node and when the two corresponding edges from the bipartite graph are connected to a same check node.

9. The computer-implemented method of claim 4, wherein determining the independent set of check nodes and variable nodes comprises applying a greedy algorithm to the search graph by at least iteratively:
selecting a particular vertex in the search graph based on the set of rules, wherein the particular vertex has a number of connections to one or more other vertices, wherein the set of rules specifies a selection of the particular vertex based on the number of connections;
adding the particular vertex to a set of vertices; and
removing the one or more other vertices from the search graph.

10. The computer-implemented method of claim 9, wherein the particular vertex is selected based on having a lowest number of connections across the vertices in the search graph, and wherein the independent set of check nodes and variable nodes is generated from the set of vertices by, for each particular vertex from the set of vertices, at least:
identifying a corresponding edge in the bipartite graph and a corresponding pair of check node and variable node connected by the corresponding edge; and
adding the corresponding pair of check node and variable node to the independent set.

11. The computer-implemented method of claim 1, wherein determining the independent set of check nodes and variable nodes comprises applying a find-matching algorithm to nodes from a bipartite graph corresponding to the first parity-check matrix by at least:
selecting a candidate set of check nodes from the bipartite graph;
for each variable node from the bipartite graph, at least:
generating a connected set of check nodes for the variable node, wherein the variable node is connected to each check node in the connected set,
determining whether a size of an intersection between the candidate set and the connected set is equal to one, and
marking, based on a determination that the size of the intersection is equal to one, a particular check node as being associated with the variable node, wherein the particular check node belongs to the candidate set and is connected to the variable node in the bipartite graph; and
for a candidate check node in the candidate set, at least:
determining whether the candidate check node is marked as being associated with a particular variable node,
adding the candidate check node and the particular variable node to a potential independent set based on a determination that the check node is marked as being associated with the particular check node; and
setting the potential independent set as the independent set of check nodes based on a size of the potential independent set.

12. The computer-implemented method of claim 11, further comprising:
generating a second potential independent set by at least varying a size of the candidate set of check nodes; and
selecting the potential independent set over the second potential independent set based on the set of rules specifying a selection according to a larger set size, and wherein the size of the potential independent set is larger than the size of the second potential independent set.

13. The computer-implemented method of claim 11, wherein sizes of potential independent sets are varied based on a binary search for a largest size set, and wherein the set of rules specifies a selection of the potential independent set based on the potential independent set having the largest size from the potential independent sets.

14. A system comprising:
one or more processors; and
one or more memories communicatively coupled with the one or more processors and storing instructions that, upon execution by the one or more processors, configure the system to at least:
  access a first parity-check matrix; and
  generate a low density parity-check (LDPC) codeword by at least encoding bits based on the first parity-check matrix, wherein the first parity-check matrix is generated by at least:
    determining, based on a set of rules, an independent set of check nodes and variable nodes associated with a second parity-check matrix, wherein:
      the set of rules specifies that a check node associated with the second parity-check matrix belongs to the independent set when the check node is connected to only one variable node from the independent set,
      the set of rules further specifies that a variable node associated with the second parity-check matrix belongs to the independent set when the variable node is connected to only one check node from the independent set, and
      a size of the independent set is based on the set of rules; and
    generating the second parity-check matrix by at least applying a permutation to the second parity-check matrix based on the independent set.

15. The system of claim 14, wherein the instructions further cause the system to at least:
  decoding the LDPC code based on the second parity-check matrix to generate intermediary bits; and
  applying an inverse permutation to the intermediary bits based on the first parity-check matrix to generate decoded bits.

16. One or more non-transitory computer storage media comprising instructions that, upon execution on a system, configure the system to perform operations comprising:
  accessing a first parity-check matrix;
  determining, based on a set of rules, an independent set of check nodes and variable nodes associated with the first parity-check matrix, wherein:
    the set of rules specifies that a check node associated with the first parity-check matrix belongs to the independent set when the check node is connected to only one variable node from the independent set,
    the set of rules further specifies that a variable node associated with the first parity-check matrix belongs to the independent set when the variable node is connected to only one check node from the independent set, and
    a size of the independent set is based on the set of rules; and
  generating a second parity-check matrix by at least applying a permutation to the first parity-check matrix based on the independent set, wherein a low density parity-check (LDPC) encoder is configured to encode bits based on the second parity-check matrix.

17. The one or more non-transitory computer storage media of claim 16, wherein the first parity-check matrix is a first quasi-cyclic LDPC (QC-LDPC) parity-check matrix, wherein the second parity-check matrix is a second QC-LDPC parity-check matrix, and wherein the operations further comprise:
  generating an intermediary first QC-LDPC parity-check matrix by at least substituting each circulant submatrices in the first QC-LDPC parity-check matrix with protograph representation;
  generating an intermediary second QC-LDPC parity-check matrix from the first intermediary first QC-LDPC parity-check matrix based on the set of rules; and
  generating the second QC-LDPC parity-check matrix by at least expanding the second QC-LDPC parity-check matrix to include the circulant submatrices.

18. The one or more non-transitory computer storage media of claim 16, wherein the first parity-check matrix is an LDPC parity-check matrix with a "k" rows, wherein the set of rules specifies a search for a largest size of the independent set by at least starting the search with a size of "k−1" and iteratively decreasing the size and repeating the search until the largest size of the independent set is found.

19. The one or more non-transitory computer storage media of claim 16, wherein the first parity-check matrix is an LDPC parity-check matrix, and wherein the set of rules further specifies a search for the independent set by at least applying a greedy algorithm to a search graph generated from a bipartite graph of the first LDPC parity-check matrix.

20. The one or more non-transitory computer storage media of claim 19, wherein the set of rules further specifies, based on a determination that a first size of the independent set found according to the greedy algorithm is lower than a size threshold, an application of a find-matching algorithm to further search for the independent set until a number of search iterations exceeds a number threshold or until a second size of the independent set found according to the find-matching algorithm is greater than the size threshold.

* * * * *